(12) United States Patent
Kim

(10) Patent No.: US 10,971,509 B2
(45) Date of Patent: Apr. 6, 2021

(54) SEMICONDUCTOR MEMORY DEVICE

(71) Applicant: SK hynix Inc., Icheon-si (KR)

(72) Inventor: Jae Taek Kim, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/683,056

(22) Filed: Nov. 13, 2019

(65) Prior Publication Data

US 2021/0005623 A1 Jan. 7, 2021

(30) Foreign Application Priority Data

Jul. 3, 2019 (KR) .................... 10-2019-0080101

(51) Int. Cl.
*H01L 27/11556* (2017.01)
*G11C 5/02* (2006.01)
*H01L 27/11582* (2017.01)

(52) U.S. Cl.
CPC ........ *H01L 27/11556* (2013.01); *G11C 5/025* (2013.01); *H01L 27/11582* (2013.01)

(58) Field of Classification Search
CPC ......... H01L 27/11556; H01L 27/11582; G11C 5/025

USPC .................................................. 365/185.11
See application file for complete search history.

(56) References Cited

U.S. PATENT DOCUMENTS 9,985,048 B2 * 5/2018 Lee .................. H01L 29/792
2010/0213526 A1 * 8/2010 Wada ............... H01L 27/11578
257/314

FOREIGN PATENT DOCUMENTS

KR 101049299 B1 7/2011
KR 101641055 B1 7/2016

* cited by examiner

Primary Examiner — Fernando Hidalgo
(74) Attorney, Agent, or Firm — William Park & Associates Ltd.

(57) ABSTRACT

A semiconductor memory device according to the present technology includes a stack body including a lower conductive pattern and an upper conductive pattern stacked apart from each other in a first direction, and at least one intermediate conductive pattern disposed between the lower conductive pattern and the upper conductive pattern, a contact plug connected to the lower conductive pattern and extending in the first direction, and at least one lower dummy plug overlapping the lower conductive pattern.

20 Claims, 20 Drawing Sheets

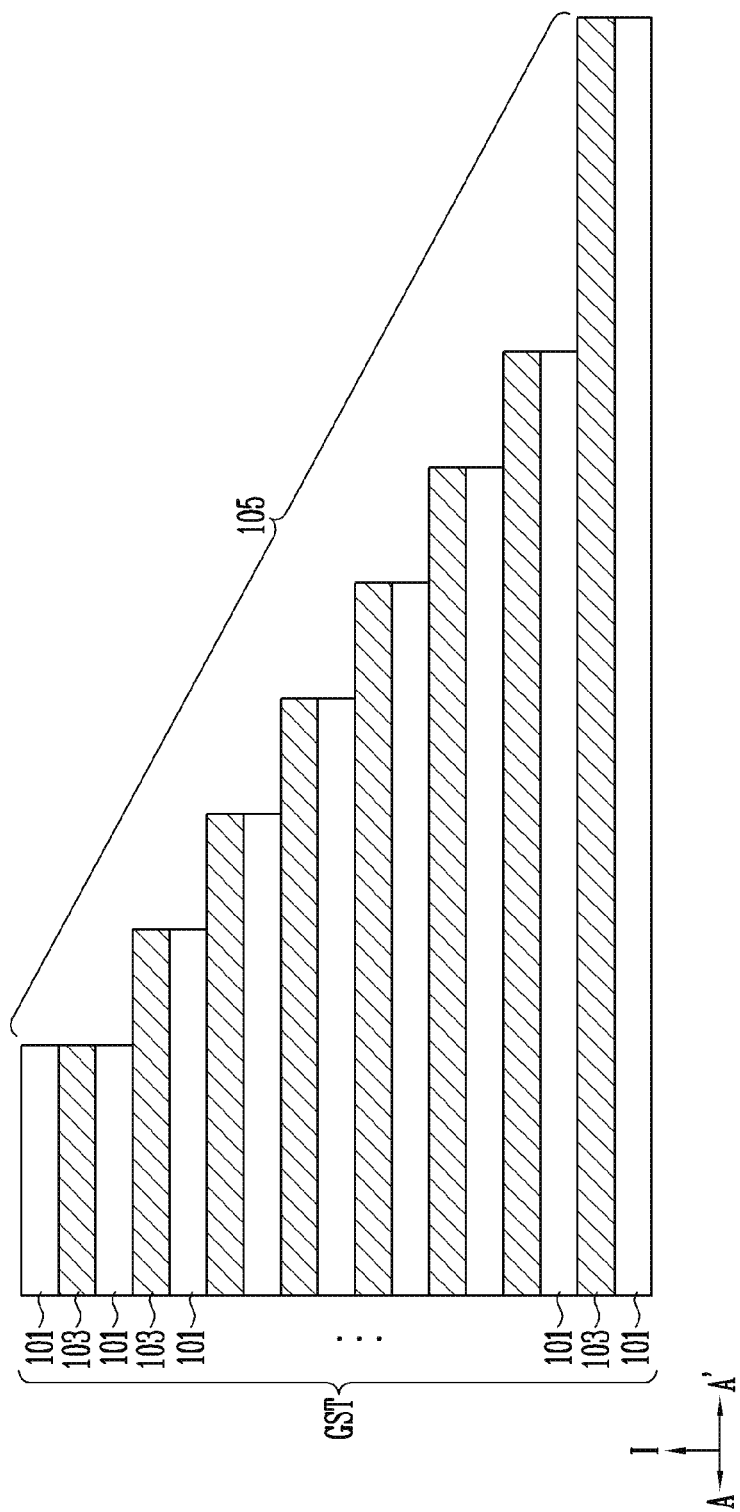

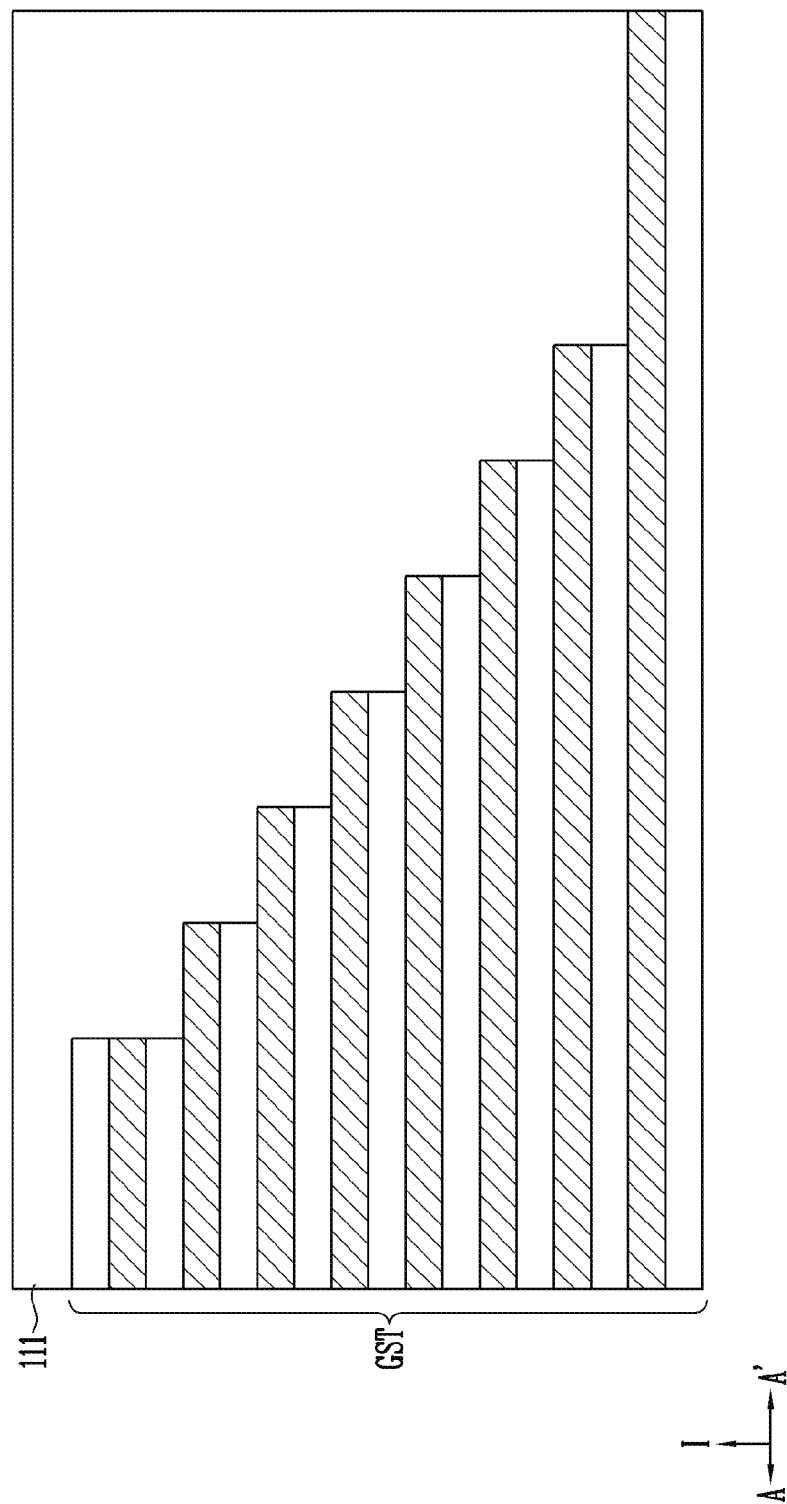

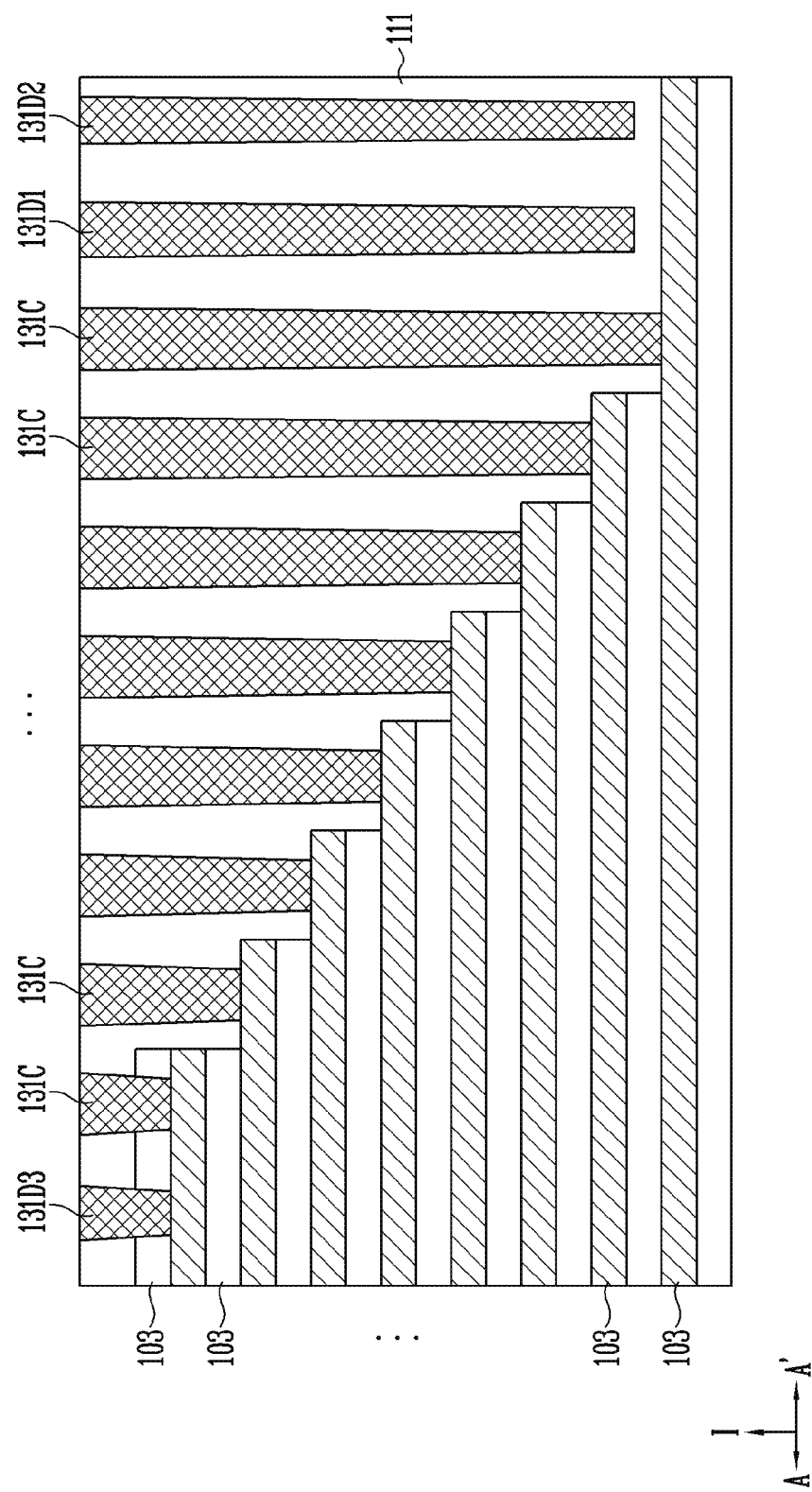

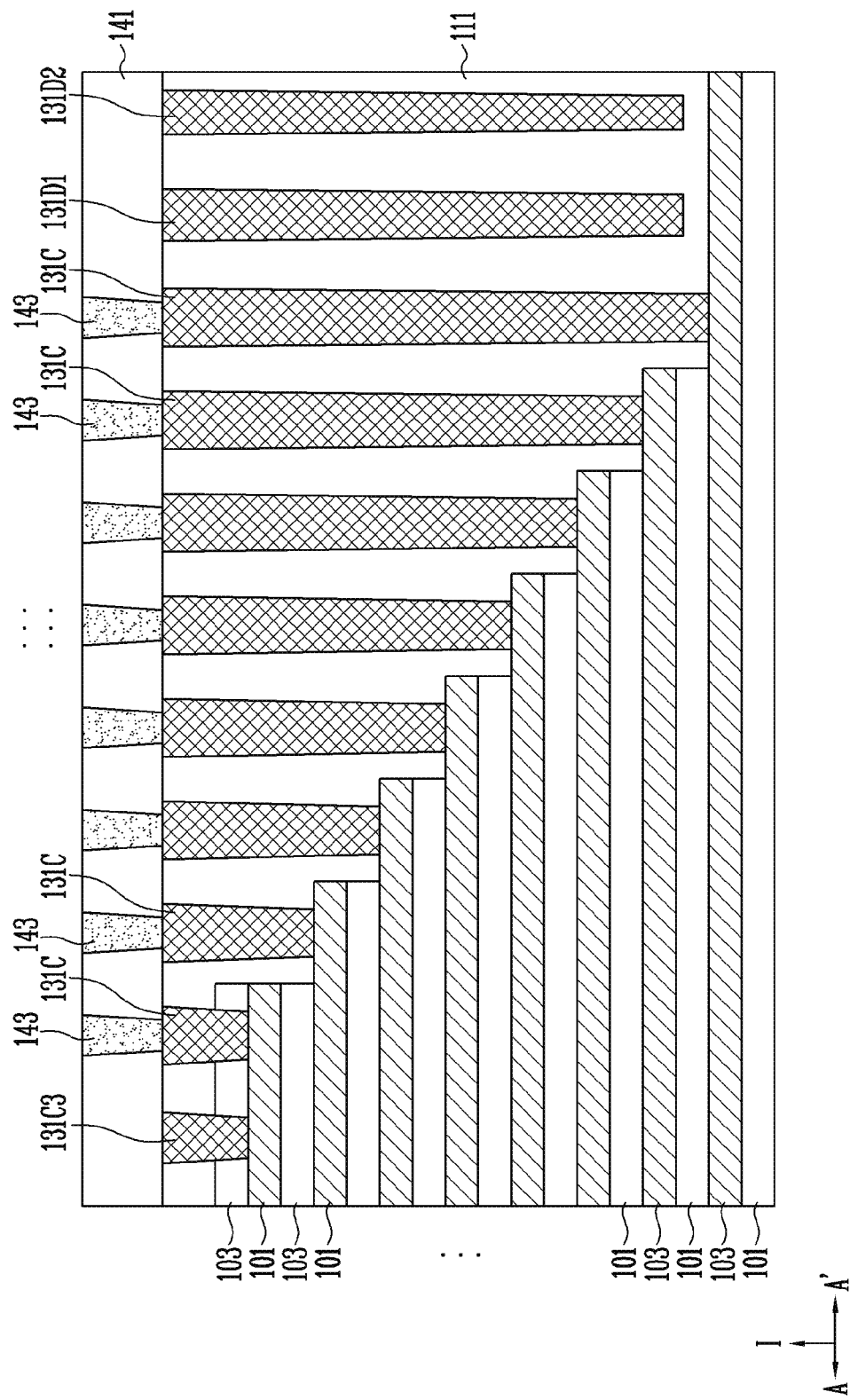

SEMICONDUCTOR MEMORY DEVICE

CROSS-REFERENCE TO RELATED APPLICATION

The present application claims priority under 35 U.S.C. § 119(a) to Korean patent application number 10-2019-0080101, filed on Jul. 3, 2019, in the Korean Intellectual Property Office, the entire disclosure of which is incorporated herein by reference.

BACKGROUND

1. Technical Field

The present disclosure generally relates to a semiconductor memory device, and more particularly, to a three-dimensional semiconductor memory device.

2. Related Art

A semiconductor memory device includes memory cells capable of storing data. In order to improve a degree of integration of the memory cells, a three-dimensional semiconductor memory device has been proposed.

The three-dimensional semiconductor memory device includes memory cells that are arranged in a three-dimension. The degree of integration of the three-dimensional semiconductor memory device may be improved as the number of stack layers of memory cells increases. As the number of stack layers of the memory cells increases, reliability of the three-dimensional semiconductor memory device may be reduced.

SUMMARY

A semiconductor memory device according to an embodiment of the present disclosure may include a stack body including a lower conductive pattern, an upper conductive pattern, and at least one intermediate conductive pattern. The lower conductive pattern and the upper conductive pattern may be stacked apart from each other in a first direction, and the intermediate conductive pattern may be disposed between the lower conductive pattern and the upper conductive pattern. The semiconductor memory device may include a first contact plug connected to the lower conductive pattern, and at least one lower dummy plug overlapping the lower conductive pattern and extending in the first direction.

A semiconductor memory device according to an embodiment of the present disclosure may include a stack body including a lower conductive pattern, an upper conductive pattern, and at least one intermediate conductive pattern, and formed in a step structure. The lower conductive pattern and the upper conductive pattern may be stacked apart from each other in a first direction, and the intermediate conductive pattern may be disposed between the lower conductive pattern and the upper conductive pattern. The semiconductor memory device may include a gap-fill insulating film covering the stack body. The semiconductor memory device may include contact plugs connected to the lower conductive pattern, the intermediate conductive pattern, and the upper conductive pattern, respectively, and extending in the first direction to penetrate the gap-fill insulating film. The semiconductor memory device may include at least one lower dummy plug overlapping the lower conductive pattern, and at least one upper dummy plug overlapping the upper conductive pattern. Each of the lower dummy plug and the one upper dummy plug may be formed in the gap-fill insulating film. The semiconductor memory device may include an upper insulating film formed on the gap-fill insulating film to cover the contact plugs, the lower dummy plug, and the upper dummy plug, and via contact patterns penetrating the upper insulating film to be connected to the contact plugs, respectively. An upper surface of each of the lower dummy plug and the upper dummy plug may be completely covered with the upper insulating film.

A semiconductor memory device according to an embodiment of the present disclosure may include a stack body including a lower conductive pattern, an upper conductive pattern, and at least one intermediate conductive pattern disposed between the lower conductive pattern and the upper conductive pattern. The semiconductor memory device may include a first contact plug connected to the lower conductive pattern and extending in the first direction. The semiconductor memory device may include at least two lower dummy plugs formed to be narrower than the first contact plug in a plane orthogonal to the first direction and overlapping the lower conductive pattern, the at least two lower dummy plugs extending in the first direction.

BRIEF DESCRIPTION OF THE DRAWINGS

FIGS. 7A to 7E are cross-sectional views illustrating a method of manufacturing a semiconductor memory device according to an embodiment of the present disclosure.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Embodiments of the present disclosure may provide a semiconductor memory device capable of improving reliability.

Figure 1:
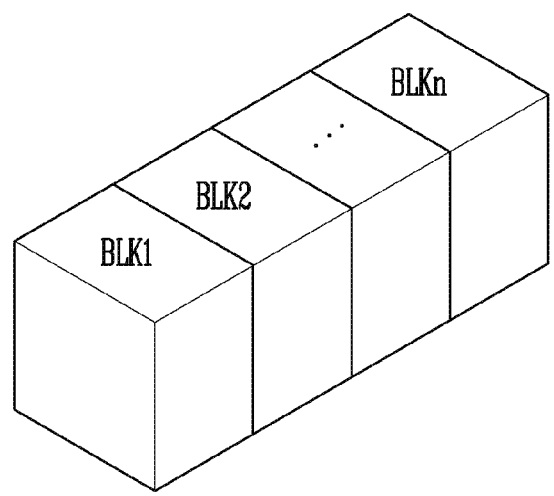
FIG. 1 is a block diagram schematically illustrating a semiconductor memory device according to an embodiment of the present disclosure.

FIG. 1 is a block diagram schematically illustrating a semiconductor memory device according to an embodiment of the present disclosure.

Referring to FIG. 1, the semiconductor memory device may include memory blocks BLK1 to BLKn. The memory blocks BLK1 to BLKn may be disposed on a partial region of a substrate (not shown). The substrate may include a silicon wafer.

As an embodiment, the memory blocks BLK1 to BLKn may be connected to a peripheral circuit (not shown) disposed on another region of the substrate. As another embodiment, the memory blocks BLK1 to BLKn may be connected to a peripheral circuit disposed between the substrate and the memory blocks BLK1 to BLKn. As further another embodiment, the memory blocks BLK1 to BLKn may be connected to a peripheral circuit disposed on the memory blocks BLK1 to BLKn.

Each of the memory blocks BLK1 to BLKn may include a cell array. The cell array may include at least one gate stack body, a channel structure passing through the gate stack body, a bit line connected to one end of the channel structure, and a source structure connected to the other end of the channel structure. The gate stack body of each of the memory blocks BLK1 to BLKn may be connected to the peripheral circuit by contact structures and interconnection wires.

Figure 2:
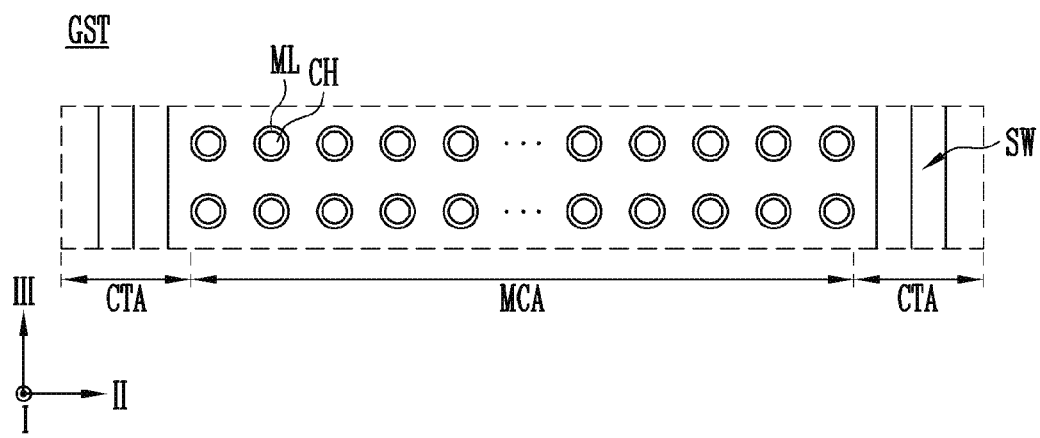
FIG. 2 is a diagram schematically illustrating a gate stack body according to an embodiment of the present disclosure.

FIG. 2 is a diagram schematically illustrating a gate stack body GST according to an embodiment of the present disclosure.

Referring to FIG. 2, the gate stack body GST may include a memory cell region MCA and at least one contact region CTA. The gate stack body GST may include interlayer insulating films and conductive patterns that are alternately stacked in a first direction I.

Each of the interlayer insulating films and the conductive patterns of the gate stack body GST may extend in a plane orthogonal to the first direction I. The interlayer insulating films and the conductive patterns of the gate stack body GST may extend from the memory cell region MCA toward the contact region CTA. For example, the interlayer insulating films and the conductive patterns of the gate stack body GST may extend in a second direction II and a third direction III which are parallel to the plane and intersecting with each other. The interlayer insulating films and the conductive patterns of the gate stack body GST may form a step structure SW in the contact region CTA.

The memory cell region MCA of the gate stack body GST may be penetrated by channel structures CH. Each sidewall of the channel structures CH may be surrounded by a memory film ML.

As an embodiment, each of the channel structures CH may include a semiconductor film filling a channel hole passing through the gate stack body GST. As another embodiment, each of the channel structures CH may include a core insulating film disposed in a center region of the channel hole passing through the gate stack body GST, and a semiconductor film surrounding the core insulating film. For example, the semiconductor film may include silicon.

A memory film ML may include a tunnel insulating film surrounding the sidewall of each of the channel structures CH, a data storage film surrounding a sidewall of the tunnel insulating film, and a blocking insulating film surrounding a sidewall of the data storage film. The tunnel insulating film may be formed of a material capable of charge tunneling. For example, the tunnel insulating film may include a silicon oxide film. The data storage film may be formed of a material that stores data that is changed using Fowler-Nordheim tunneling. For example, the data storage film may include a nitride film capable of charge trapping. The present disclosure is not limited thereto, and the data storage film may include silicon, a phase change material, a nano dot, and the like. The blocking insulating film may include an oxide film capable of charge blocking.

The channel structures CH may be arranged in a matrix structure along the second direction II and the third direction III parallel to the plane orthogonal to the first direction I. An embodiment of the present disclosure is not limited thereto. For example, the channel structures CH may be arranged in a zigzag pattern along the second direction II and the third direction III. The second direction II and the third direction III are different directions, and lines along the second direction II and the third direction III may intersect with each other.

Each of the channel structures CH may connect source select transistor, drain select transistor, and memory cells corresponding thereto in series. The source select transistor, the drain select transistor, and the memory cells connected in series may configure a cell string.

FIGS. 3A to 3E are perspective views illustrating various embodiments of a cell string formed in the cell array region of the gate stack body. For convenience of recognition, the interlayer insulating films are not shown in FIGS. 3A to 3E. A first direction I, a second direction II, and a third direction III shown in FIGS. 3A to 3E are the same as defined with reference to FIG. 2.

Referring to FIGS. 3A to 3E, each of the cell strings CST may include the gate structure body GST and the channel structure CH surrounded by the gate stack body GST. The gate stack body GST may be disposed under the bit lines BL. The gate stack body GST may include conductive patterns CP1 to CPn (n is a natural number) that are stacked apart from each other in the first direction I. The bit lines BL may extend in the third direction III and may be spaced apart from each other in the second direction II.

The one end of the channel structure CH may be connected to a corresponding bit line via a bit line contact plug BCT. The channel structure CH may extend in the first direction I to pass through at least some of the conductive patterns CP1 to CPn.

The conductive patterns CP1 to CPn may be disposed in an n-th layer disposed closest to the bit lines BL from a first layer disposed farthest from the bit lines BL.

Referring to FIGS. 3A to 3D, the n-th patterns CPn of the conductive patterns CP1 to CPn disposed in at least n-th layer may be used as drain select lines DSL. The present disclosure is not limited thereto. For example, the n-th patterns CPn disposed in the n-th layer may be used as the drain select lines DSL, and the (n−1)-th conductive patterns CPn−1 of the conductive patterns CP1 to CPn disposed in an (n−1)-th layer may be used as other drain select lines DSL.

The first pattern CP1 of the conductive patterns CP1 to CPn disposed in at least first layer may be used as source select line SSL. The present disclosure is not limited thereto. For example, the first pattern CP1 disposed in the first layer may be used as the source select line SSL, and the second pattern CP2 of the conductive patterns CP1 to CPn disposed in a second layer may be used as another source select lines SSL.

The conductive patterns (for example, CP3 to CPn−2) disposed between the drain select lines DSL and the source select lines SSL may be used as word lines WL.

The drain select lines DSL disposed in the same layer may be separated from each other by an upper slit USI overlapping the word lines WL.

Figure 3A:
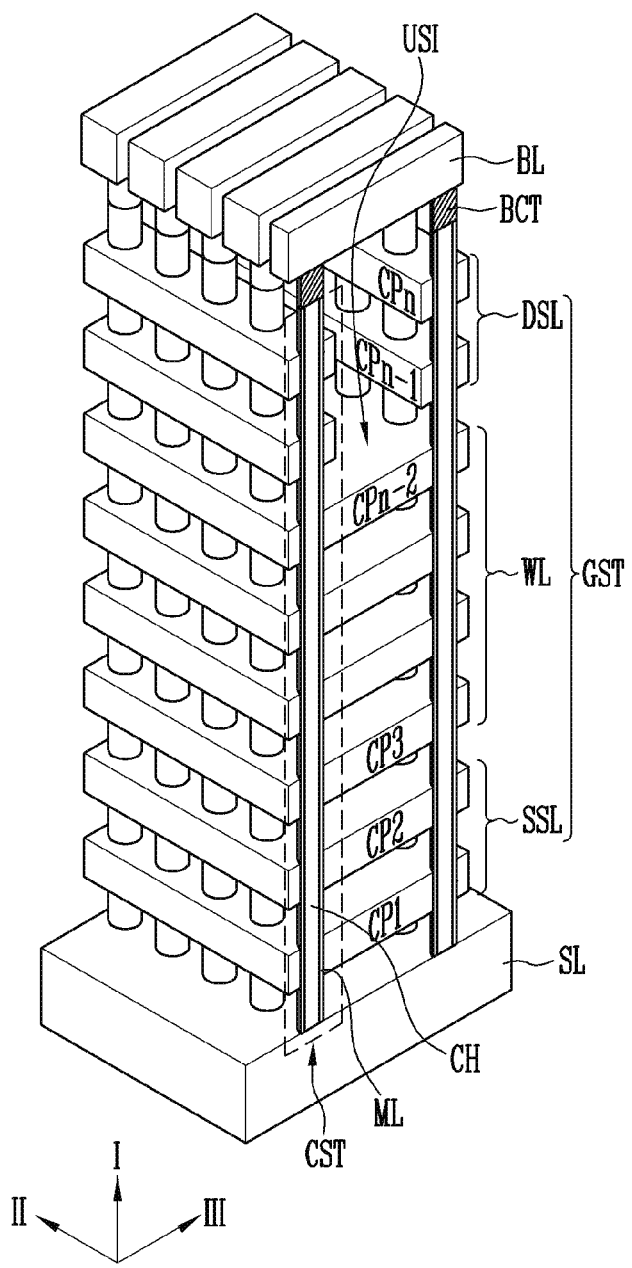
FIGS. 3A to 3E are perspective views illustrating various embodiments of a cell string formed in a cell array region of the gate stack body.
Figure 3B:
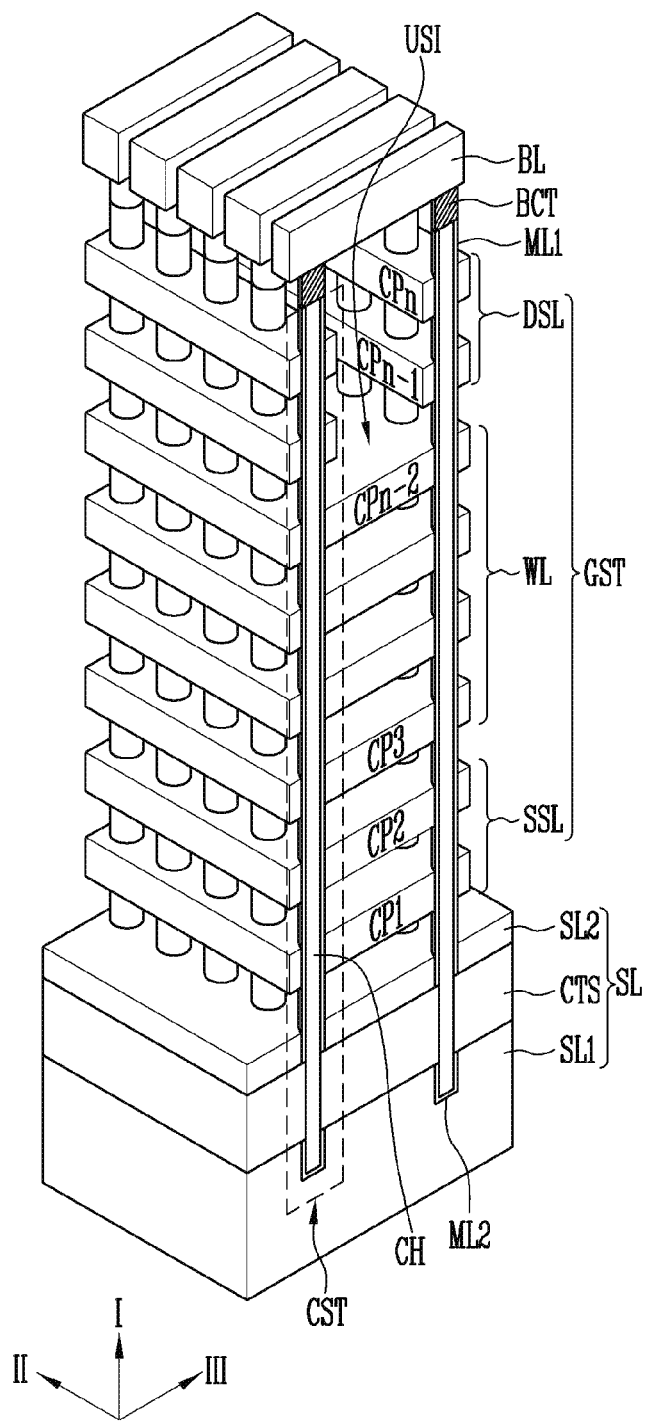
Figure 3C:
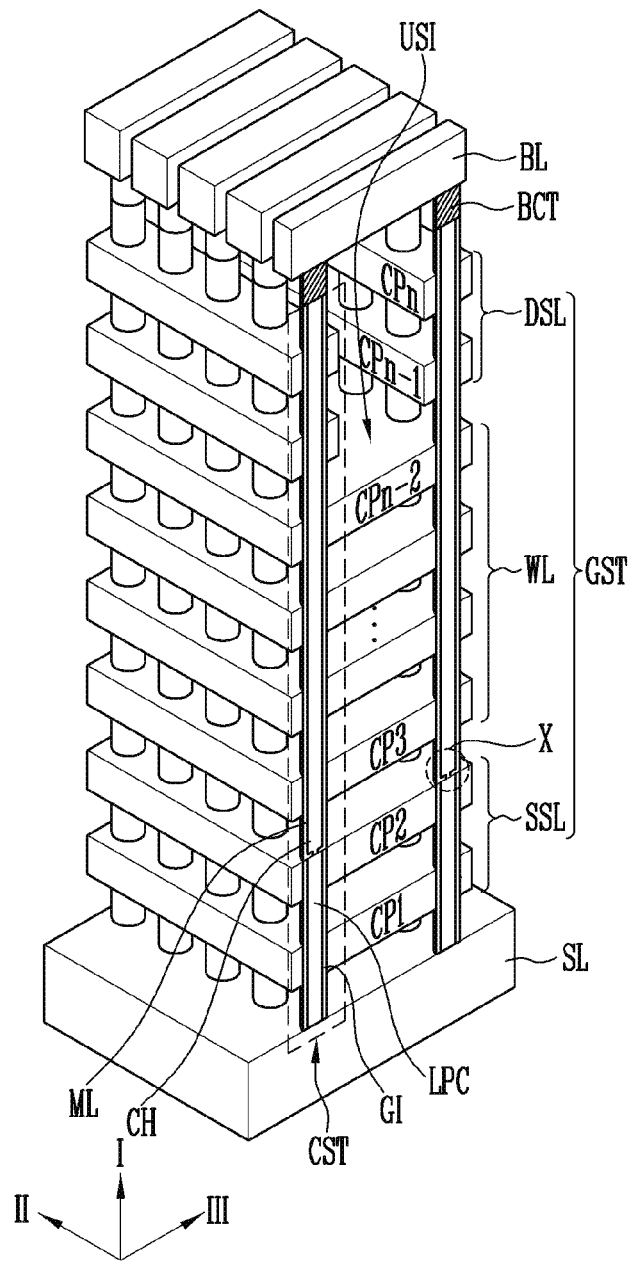
Figure 3D:
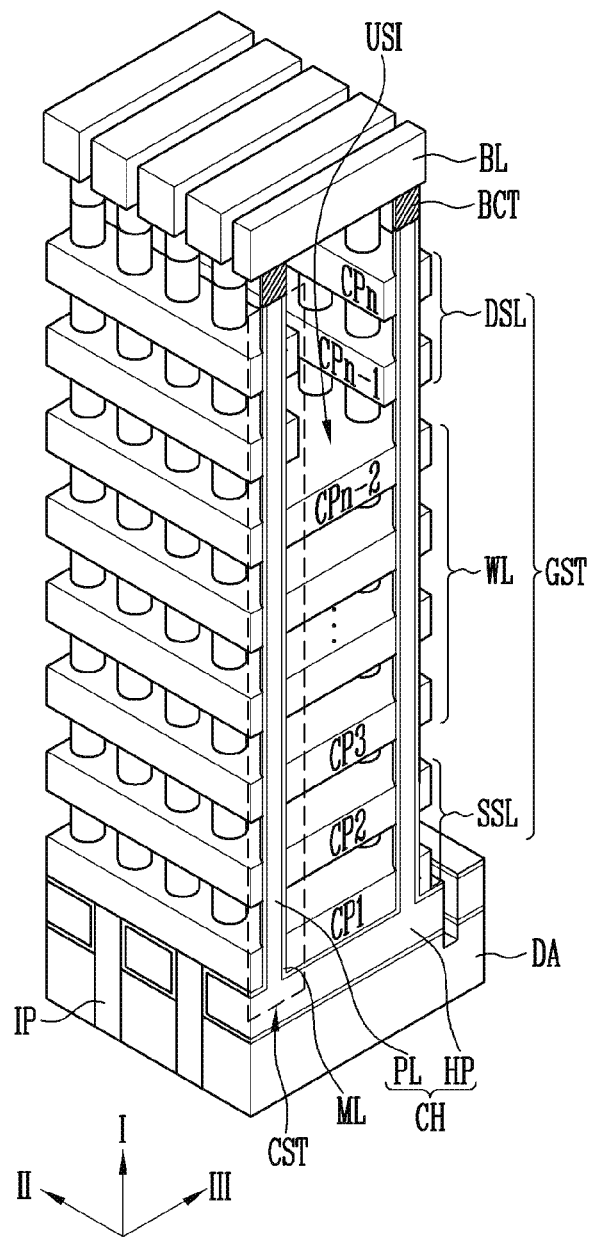
Figure 3E:
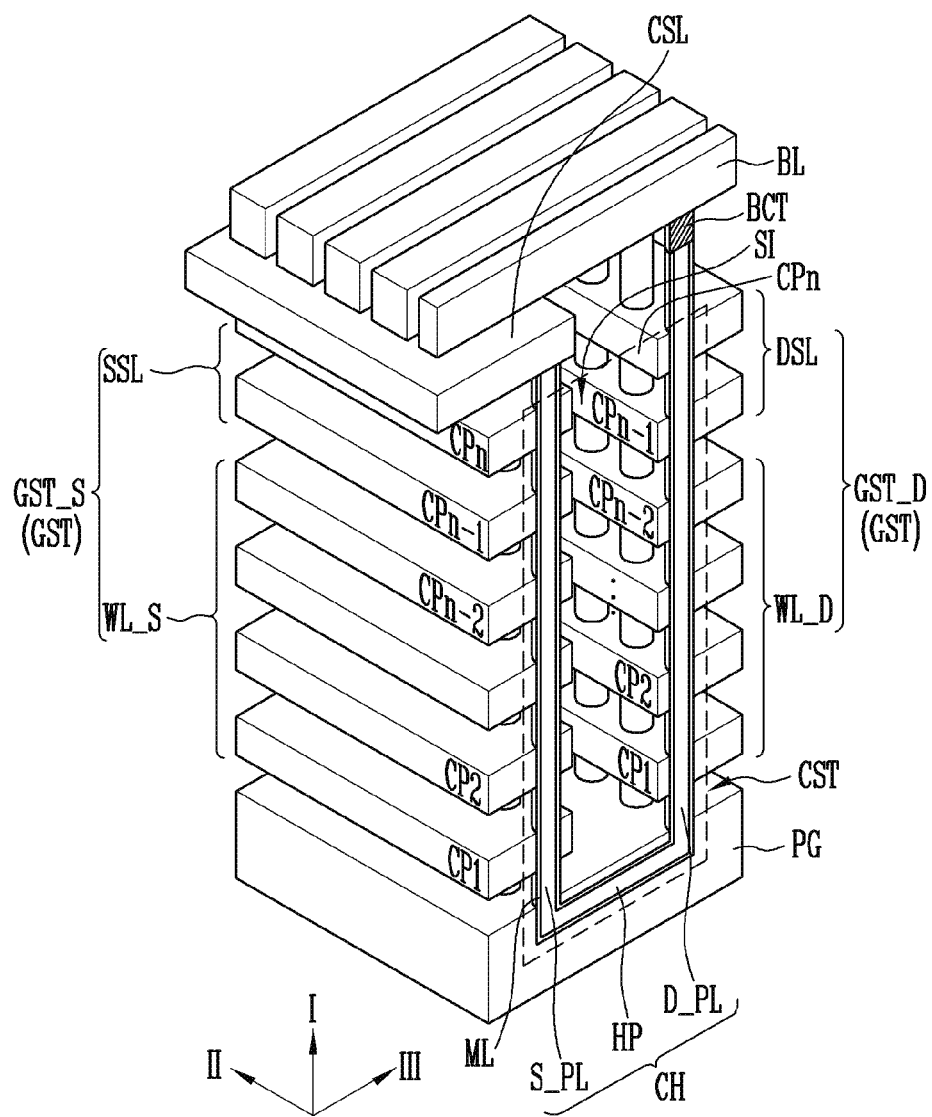

As another example, referring to FIG. 3E, the conductive patterns CP1 to CPn of the gate stack body GST may be penetrated by a slit SI. The gate stack body GST may be separated into a source side stack body GST_S and a drain side stack body GST_D by the slit SI.

The n-th patterns CPn of the conductive patterns CP1 to CPn disposed in the n-th layer may be used as the drain select line DSL and the source select line SSL. The present disclosure is not limited thereto. For example, the n-th patterns CPn disposed in the n-th layer may be used as the drain select line DSL and the source select line SSL, and the (n−1)-th patterns CPn−1 of the conductive patterns CP1 to CPn disposed in the (n−1)-th layer may be used as another drain select line DSL and another source select line SSL. The source select lines SSL are included in the source side stack body GST_S, and the drain select lines DSL are included in the drain side stack body GST_D.

The conductive patterns (for example, CP1 to CPn−2) included in the drain side stack body GST_D and disposed under the drain select lines DSL may be used as drain side word lines WL_D. The conductive patterns (for example, CP1 to CPn−2) included in the source side stack body GST_S and disposed under the source select lines SSL may be used as source side word lines WL_S.

Referring to FIGS. 3A to 3E again, the source select lines SSL may be used as gates of the source select transistors. The word lines WL, the drain side word lines WL_D, and the source side word lines WL_S may be used as gates of the memory cells. The drain select lines DSL may be used as gates of the drain select transistors.

Each of the cell strings CST may include at least one source select transistor, memory cells connected in series to the source select transistor, and at least one drain select transistor connected to the memory cells in series. The channel structure CH may be formed in various structures to connect the memory cells in series.

Referring to FIG. 3A, the channel structure CH may pass through the drain select lines DSL, the word lines WL, and the source select lines SSL. The other end of the channel structure CH may be directly connected to a source structure SL disposed under the conductive patterns CP1 to CPn.

The source structure SL may be in contact with a bottom surface of the channel structure CH. The source structure SL may be formed of a doped semiconductor film including a source dopant. The source dopant may include an n-type impurity. For example, the source structure SL may include n-type doped silicon.

The sidewall of the channel structure CH may be surrounded by the memory film ML. The memory film ML may extend along the sidewall of the channel structure CH to open an upper surface and the bottom surface of the channel structure CH.

Referring to FIG. 3B, the channel structure CH may pass through the drain select lines DSL, the word lines WL, and the source select lines SSL, and may extend to an inside of the source structure SL disposed under the conductive patterns CP1 to CPn.

The source structure SL may include a first source film SL1, a contact source film CTS, and a second source film SL2. The channel structure CH may pass through the second source film SL2 and the contact source film CTS, and may extend to an inside of the first source film SL1.

The first source film SL1 may surround the other end of the channel structure CH. The first source film SL1 may be formed of a doped semiconductor film including a source dopant. The source dopant may include an n-type impurity. For example, the first source film SL1 may include n-type doped silicon.

The contact source film CTS may be disposed on the first source film SL1 and may be directly connected to an upper surface of the first source film SL1. The contact source film CTS may be further protruded to a side portion toward the channel structure CH than the first source film SL1 and the second source film SL2 and may be directly connected to the sidewall of the channel structure CH. The contact source film CTS surrounds the channel structure CH.

The second source film SL2 may be disposed between the contact source film CTS and the source select lines SSL. As an embodiment, the second source film SL2 may be omitted.

Each of the contact source film CTS and the second source film SL2 may be formed of a doped semiconductor film including a source dopant. The source dopant may include an n-type impurity. For example, each of the contact source film CTS and the second source film SL2 may include n-type doped silicon.

The channel structure CH includes an upper end protruding toward the bit lines BL than the contact source film CTS. The upper sidewall of the channel structure CH may be surrounded by a first memory film ML1. A second memory film ML2 may be disposed between the channel structure CH and the first source film SL1. The first memory film ML1 and the second memory film ML2 may be separated from each other by the contact source film CTS, as portions of the memory film.

Referring to FIG. 3C, the channel structure CH may pass through the drain select lines DSL and the word lines WL. The channel structure CH may be connected to a lower channel structure LPC passing through the source select lines SSL.

Figure 4:
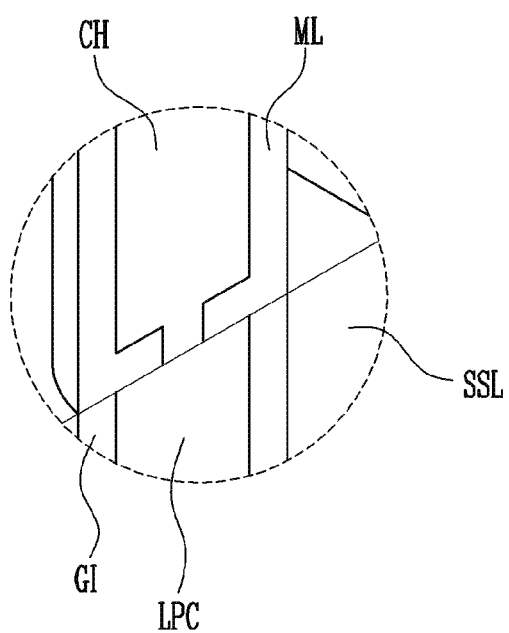
FIG. 4 is an enlarged view of an X region shown in FIG. 3C.

FIG. 4 is an enlarged view of an X region shown in FIG. 3C.

Referring to FIGS. 3C and 4, the lower channel structure LPC is connected a bottom of the channel structure CH corresponding thereto. The lower channel structure LPC may include a doped semiconductor film. For example, the lower channel structure LPC may include n-type doped silicon. The channel structure CH may be surrounded by the memory film ML. The memory film ML may extend along the sidewall of the channel structure CH to open the upper surface and the bottom surface of the channel structure CH. A sidewall of the lower channel structure LPC may be surrounded by a gate insulating film GI. The gate insulating film GI may extend along the sidewall of the lower channel structure LPC to open an upper surface and a bottom surface of the lower channel structure LPC.

The source structure SL may be directly connected to the bottom surface of the lower channel structure LPC. The source structure SL may be formed of the same material as the source structure described with reference to FIG. 3A. The channel structure CH may be connected to the source structure SL via the lower channel structure LPC.

Referring to FIG. 3D, the channel structure CH may include pillars PL passing through the conductive patterns CP1 through CPn and a horizontal portion HP extending from the pillars PL in a horizontal direction. The horizontal portion HP of the channel structure CH may extend parallel to a lower surface of the first pattern CP1. The horizontal portion HP may be disposed between a doped region DA and the first pattern CP1.

The doped region DA may be formed of a doped semiconductor film including a well dopant. The well dopant may include a p-type impurity. For example, the doped region DA may include p-type doped silicon.

The doped region DA and the horizontal portion HP may be penetrated by insulating pillars IP.

A sidewall of each of the pillars PL may be surrounded by the memory film ML. The memory film ML may extend to a portion between the horizontal portion HP and the first pattern CP1, a portion between the horizontal portion HP and each of the insulating pillars IP, and a portion between the horizontal portion HP and the doped region DA.

Referring to FIG. 3E, the channel structure CH may include a source side pillar S_PL, a drain side pillar D_PL, and the horizontal portion HP. The drain side pillar D_PL may be electrically connected to the bit line BL corresponding thereto. The drain-side pillar D_PL passes through the drain-side stack body GST_D and is connected to the horizontal portion HP. The source side pillar S_PL may be electrically connected to the common source line CSL disposed between the bit lines BL and the source side stack body GST_S. The source side pillar S_PL passes through the source side stack body GST_S and is connected to the horizontal portion HP. The horizontal portion HP may be embedded in a pipe gate PG. The pipe gate PG may be disposed under the source side stack body GST_S and the drain side stack body GST_D, and may be formed to surround the horizontal portion HP. The pipe gate PG may be used as a gate of a pipe transistor. The pipe transistor may electrically connect the source side pillar S_PL and the drain side pillar D_PL through the horizontal portion HP according to a signal transmitted to the pipe gate PG.

An outer wall of the channel structure CH may be surrounded by the memory film ML. The memory film ML may extend along the outer wall of the channel structure CH to open an upper surface of the drain side pillar D_PL and an upper surface of the source side pillar S_PL.

The cell string CST shown in FIGS. 3A to 3E may be disposed in the memory cell region MCA of the gate stack body GST described with reference to FIG. 2.

Figure 5A:
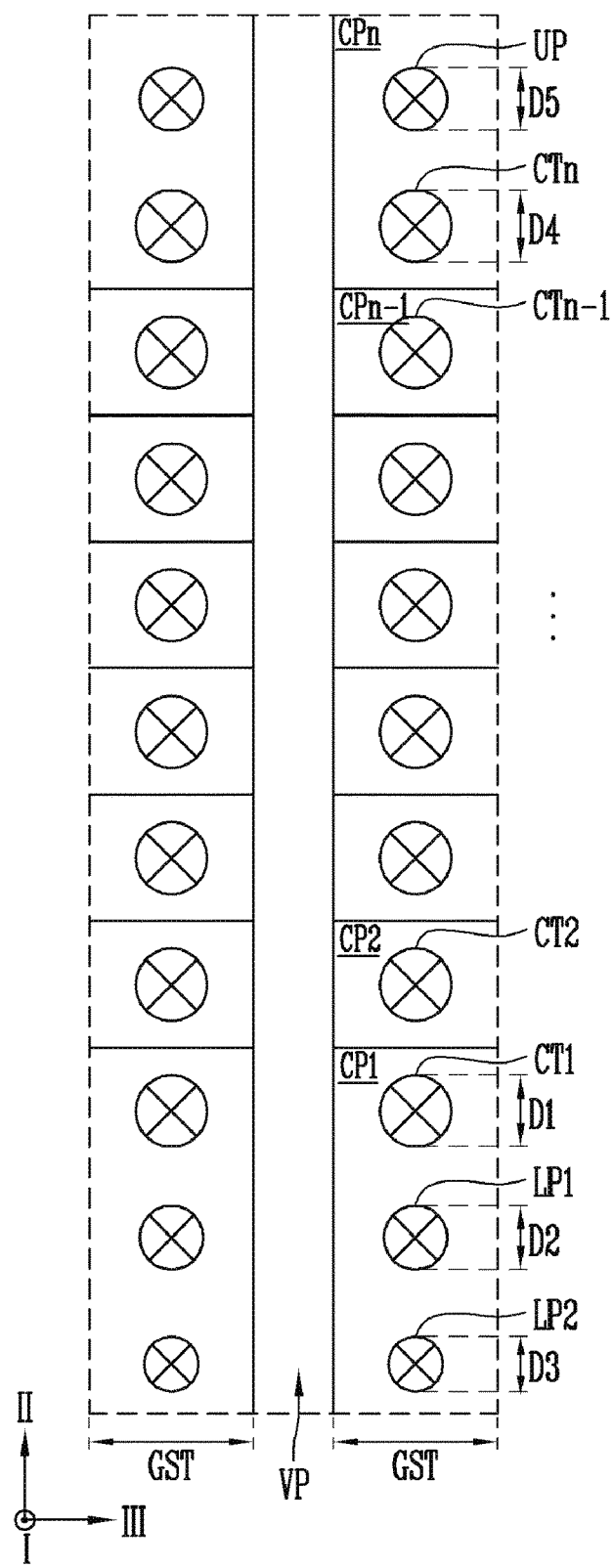
FIGS. 5A and 5B are plan views illustrating contact structures connected to the gate stack bodies.
Figure 5B:
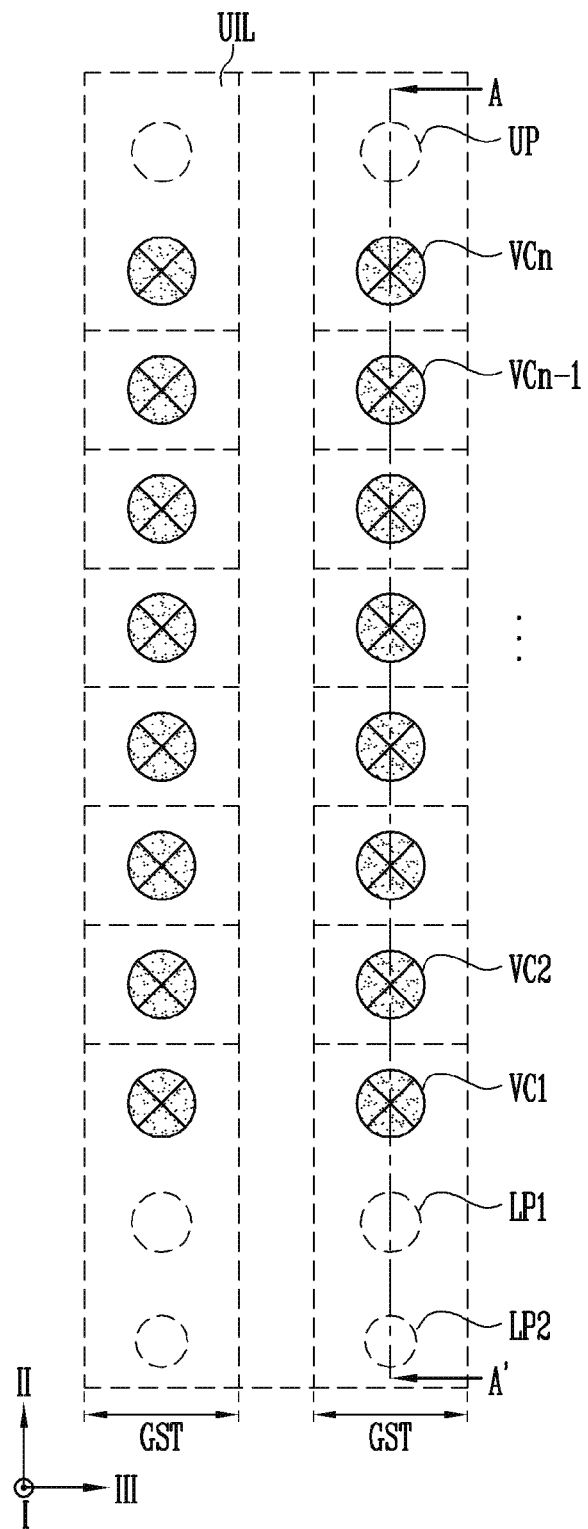

FIGS. 5A and 5B are plan views illustrating the contact structures connected to the gate stack bodies. A first direction I, a second direction II, and a third direction III shown in FIGS. 5A and 5B are the same as defined with reference to FIG. 2.

Referring to FIGS. 5A and 5B, the contact structures may include contact plugs CT1 to CTn and via contact patterns VC1 to VCn connected to the contact plugs CT1 to CTn. The via contact patterns VC1 to VCn may be disposed on the contact plugs CT1 to CTn.

FIG. 5A is a plan view illustrating the gate stack bodies GST that are adjacent to each other and the contact plugs CT1 to CTn connected to the gate stack bodies GST. FIG. 5A shows a contact region of each of the gate stack bodies GST.

Referring to FIG. 5A, the gate stack bodies GST may be separated from each other by a vertical structure VP extending in the second direction II. As an embodiment, the vertical structure VP may be formed of an insulating material. As another embodiment, the vertical structure VP may include spacer insulating films formed on a sidewall of the gate stack bodies GST and a vertical conductive pattern filling between the spacer insulating films.

Each of the gate stack bodies GST may include the conductive patterns CP1 to CPn as described above with reference to FIGS. 3A to 3E. The conductive patterns CP1 to CPn may be stacked apart from each other in the first direction I and may form a step structure. The conductive patterns CP1 to CPn may include a lower conductive pattern configuring the lowermost end of the step structure, an upper conductive pattern configuring the uppermost end of the step structure, and at least one intermediate conductive pattern disposed between the lower conductive pattern and the upper conductive pattern. Hereinafter, for convenience of description, the first pattern CP1 is referred to as the lower conductive pattern, the n-th pattern is referred to as the upper conductive pattern, and the second to (n−1)-th patterns CP2 to CPn−1 between the first pattern CP1 and the n-th pattern CPn are referred to as the intermediate conductive patterns.

The conductive patterns CP1 to CPn may be connected to the contact plugs CT1 to CTn, respectively. The contact plugs CT1 to CTn may extend in the first direction I. The contact plugs CT1 to CTn may include a first contact plug CT1 connected to the lower conductive pattern CP1, a second contact plug CTn connected to the upper conductive pattern CPn, and third contact plugs CT2 to CTn−1 connected to the intermediate conductive patterns CP2 to CPn−1, respectively. The contact plugs CT1 to CTn may be formed of various conductive materials. The first contact plug CT1, the second contact plug CTn, and the third contact plugs CT2 to CTn−1 may be disposed between at least one of lower dummy plugs LP1 and LP2 and at least one upper dummy plug UP.

The lower dummy plugs LP1 and LP2 and the upper dummy plug UP may be formed of the same conductive material as the contact plugs CT1 to CTn. The lower dummy plugs LP1 and LP2, the first contact plug CT1, the second contact plug CTn, the third contact plugs CT2 to CTn−1, and the upper dummy plug UP may be arranged in one direction. For example, the lower dummy plugs LP1 and LP2, the first contact plug CT1, the second contact plug CTn, the third contact plugs CT2 to CTn−1, and the upper dummy plug UP may be arranged in the second direction II.

The lower dummy plugs LP1 and LP2 overlap the lower conductive pattern CP1. The lower dummy plugs LP1 and LP2 may include a first lower dummy plug LP1 disposed adjacent to the first contact plug CT1. The lower dummy plugs LP1 and LP2 may further include a second lower dummy plug LP2. The first contact plug CT1 and the lower dummy plugs LP1 and LP2 may be arranged in a line along one direction. For example, the first contact plug CT1 and the lower dummy plugs LP1 and LP2 may be arranged in a line in the second direction II. The number of the lower dummy plugs LP1 and LP2 arranged in one direction is not limited to that shown in the figure. For example, three or more lower dummy plugs may overlap the lower conductive pattern CP1.

In a plane orthogonal to the first direction I, each of the lower dummy plugs LP1 and LP2 may be narrower than the first contact plug CT1. The lower dummy plugs LP1 and LP2 may be narrower as a distance between the lower dummy plugs LP1 and LP2 and the first contact plug CT1 increases. For example, the first contact plug CT1 may be formed with a first diameter D1, the first lower dummy plug LP1 may be formed with a second diameter D2 narrower than the first diameter D1, and the second lower dummy plug LP2 may be formed with a third diameter D3 narrower than the second diameter D2 (D1>D2>D3).

The upper dummy plug UP overlaps the upper conductive pattern CPn. The upper dummy plug UP may be disposed adjacent to the second contact plug CTn. For example, the upper dummy plug UP and the second contact plug CTn may be disposed adjacent to each other in the second direction II. The number of the upper dummy plugs UP is not limited to that shown in the figure. For example, two or more upper dummy plugs may overlap the upper conductive pattern CPn.

In the plane orthogonal to the first direction I, the upper dummy plug UP may be narrower than the second contact plug CTn. For example, the second contact plug CTn may be formed with a fourth diameter D4 and the upper dummy plug UP may be formed with a fifth diameter D5 narrower than the fourth diameter D4 (D4>D5).

FIG. 5B is a plan view illustrating the via contact patterns VC1 to VCn connected to the contact plugs CT1 to CTn shown in FIG. 5A, respectively.

Referring to FIG. 5B, the via contact patterns VC1 to VCn may be connected to the contact plugs CT1 to CTn shown in FIG. 5A, respectively, and extend in the first direction I to pass through an upper insulating layer UIL. Although not shown in the figure, the via contact patterns VC1 to VCn may be connected to interconnection wires connected to a peripheral circuit (not shown).

The upper insulating layer UIL overlaps the gate stack bodies GST, the lower dummy plugs LP1 and LP2, and the upper dummy plug UP. An upper surface of each of the lower dummy plugs LP1 and LP2 and the upper dummy plug UP may be completely covered with the upper insulating layer UIL. In other words, the lower dummy plugs LP1 and LP2 and the upper dummy plug UP may be separated from the via contact patterns VC1 to VCn so as not to be involved in an operation by signals applied to the first contact plug CT1, the second contact plug CTn, and the third contact plugs CT2 to CTn−1.

Figure 6A:
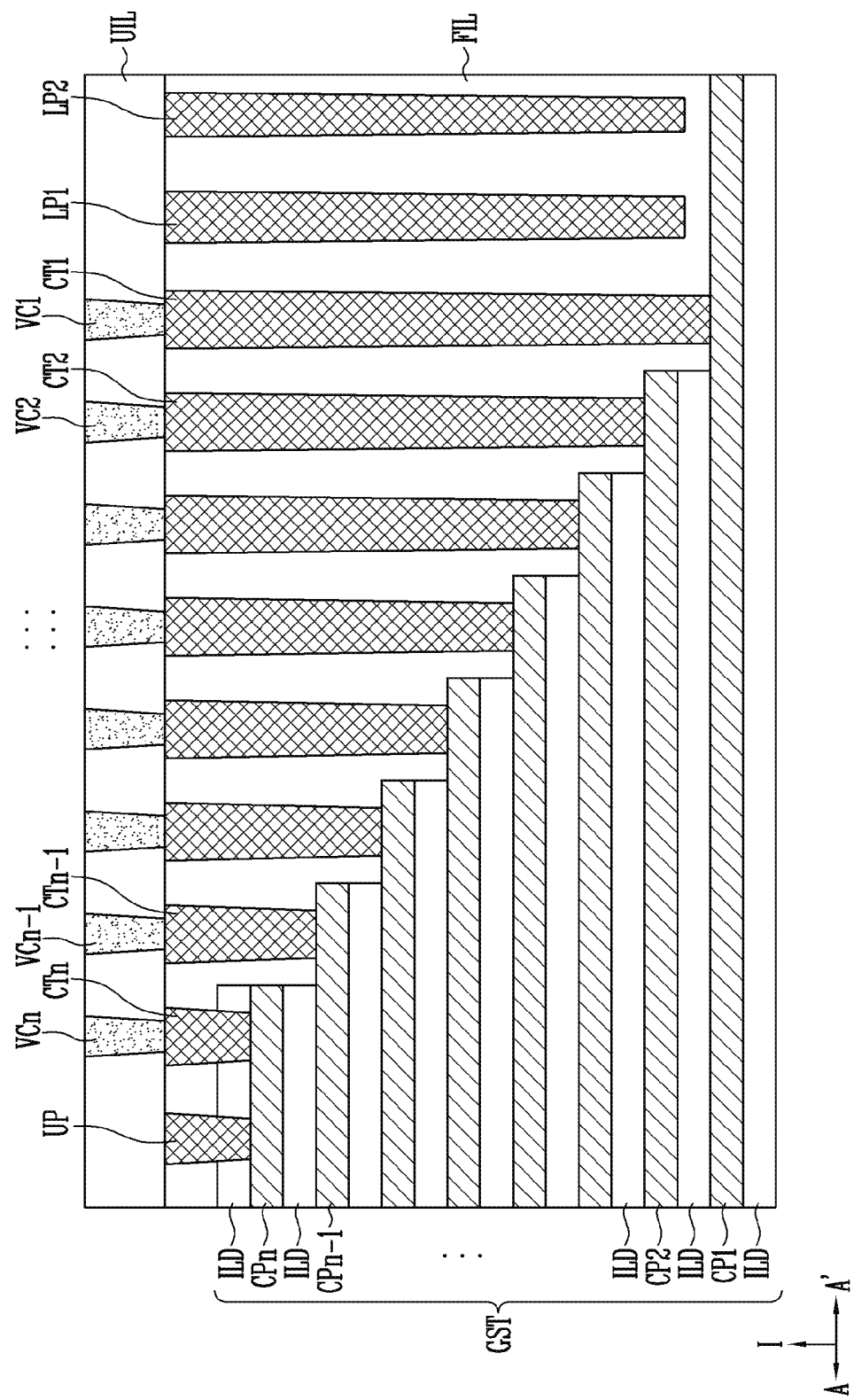
FIGS. 6A and 6B are cross-sectional views illustrating various embodiments of the contact structures shown in FIGS. 5A and 5B.
Figure 6B:
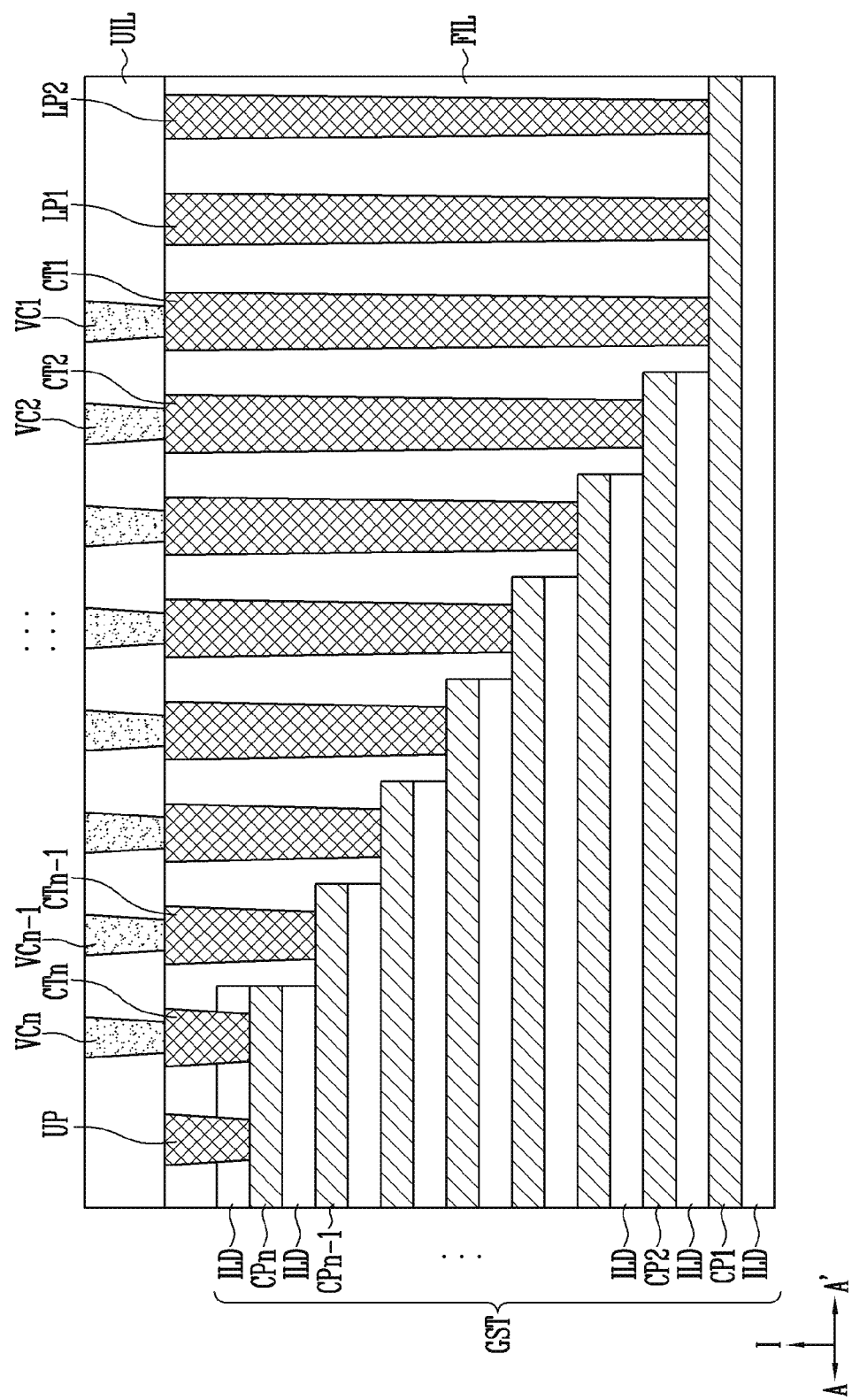

FIGS. 6A and 6B are cross-sectional views illustrating various embodiments of the contact structures shown in FIGS. 5A and 5B. Each of FIGS. 6A and 6B shows a cross section taken along a line A-A' shown in FIG. 5B.

Referring to FIGS. 6A and 6B, the gate stack body GST may include interlayer insulating films ILD and conductive patterns CP1 to CPn, which are alternately stacked in the first direction I. The interlayer insulating films ILD and the conductive patterns CP1 to CPn may be stacked to form a step structure. For example, the conductive patterns CP1 to CPn may extend to a side portion from the upper conductive pattern CPn toward the lower conductive pattern CP1. The conductive patterns CP1 to CPn may include contact regions exposed by the step structure, respectively. The lower dummy plugs LP1 and LP2, the contact plugs CT1 to CTn, and the upper dummy plug UP may overlap the contact regions of the conductive patterns CP1 to CPn exposed by the step structure.

The gate stack body GST may be covered with a gap-fill insulating film FIL. The gap-fill insulating film FIL may extend to cover the step structure of the gate stack body GST, and may alleviate a step defined by the step structure.

The lower dummy plugs LP1 and LP2, the contact plugs CT1 to CTn, and the upper dummy plug UP may extend to an inside of the gap-fill insulating film FIL. The contact plugs CT1 to CTn may be directly connected to the conductive patterns CP1 to CPn and may extend in the first direction I to pass through the gap-fill insulating film FIL.

The first contact plug CT1 may be disposed closer to the contact regions of the intermediate conductive patterns CP1 to CPn−1 than the lower dummy plugs LP1 and LP2. The second contact plug CTn may be disposed closer to the contact regions of the intermediate conductive patterns CP1 to CPn−1 than the upper dummy plug UP.

The upper dummy plug UP is shorter than the first contact plug CT1 and the lower dummy plugs LP1 and LP2 in the first direction I. The upper dummy plug UP may be directly connected to the upper conductive pattern CPn and may extend in the first direction I to pass through the gap-fill insulating film FIL.

Referring to FIG. 6A, the lower dummy plugs LP1 and LP2 may be spaced apart from the lower conductive pattern CP1 in the first direction I. In other words, the gap-fill insulating film FIL may extend between the lower conductive pattern CP1 and the lower dummy plugs LP1 and LP2. Therefore, the lower dummy plugs LP1 and LP2 may be formed to be shorter than the first contact plug CT1 in the first direction I.

Referring to FIG. 6B, when an etching process margin for forming contact holes filled with the lower dummy plugs LP1 and LP2, the contact plugs CT1 to CTn, and the upper dummy plug UP is secured, the dummy plugs LP1 and LP2 may pass through the gap-fill insulating film FIL to be connected to the lower conductive pattern CP1.

Referring to FIGS. 6A and 6B again, the gap-fill insulating film FIL may be covered with the upper insulating film UIL. The via contact patterns VC1 to VCn may pass through the upper insulating film UIL to be connected to the contact plugs CT1 to CTn.

The gate stack bodies GST shown in FIGS. 5A and 5B and FIGS. 6A and 6B may be penetrated by the channel structure CH that extends to the memory cell region MCA and surrounded by the memory film ML as shown in FIG. 2.

FIGS. 7A to 7E are cross-sectional views illustrating a method of manufacturing a semiconductor memory device according to an embodiment of the present disclosure.

Referring to FIG. 7A, the gate stack body GST including interlayer insulating films 101 and conductive patterns 103 which are alternately stacked to form a step structure 105 is formed.

Forming the gate stack body GST may include forming a preliminary stack body in which first material films and second material films are alternately stacked, and etching the first material films and the second material films to form the step structure 105. Although not shown in the figure, forming the gate stack body GST may further include forming a channel structure passing through the preliminary stack body etched to the step structure 105.

In the above description, the second material films may be formed of a material different from that of the first material films. As an embodiment, the first material films may be formed of an insulating material for the interlayer insulating films 101, and the second material films may be formed of a conductive material for the conductive patterns 103. As another embodiment, the first material films may be formed of an insulating material for the interlayer insulating films 101, and the second material films may be formed of a sacrificial material having an etching rate different from that of the first material films. The sacrificial material having the etching rate different from that of the first material films may be replaced with the conductive patterns 103 in a subsequent process. As yet another embodiment, the first material films may be formed of a sacrificial material having an etching rate different from that of the conductive patterns 103, and the second material films may be formed of a conductive material for the conductive patterns 103. The sacrificial material having the etching rate different from that of the conductive patterns 103 may be replaced with the interlayer insulating films 101 in a subsequent process.

Referring to FIG. 7B, after the gate stack body GST is formed, the gate stack body GST may be covered with a gap-fill insulating film 111. A step difference due to the step structure 105 shown in FIG. 7A may be alleviated by the gap-fill insulating film 111.

Figure 7C:
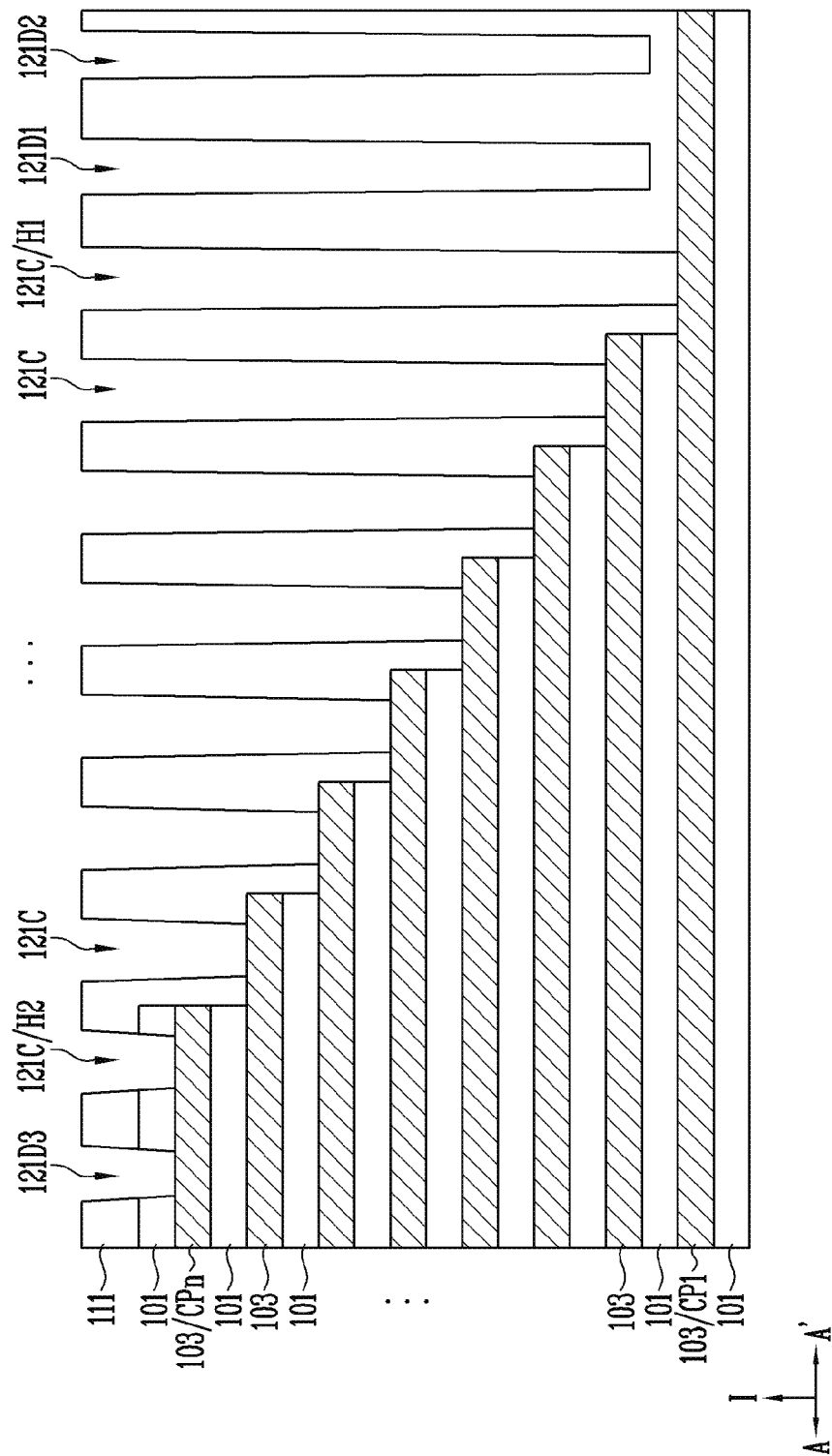

Referring to FIG. 7C, holes 121C, 121D1, 121D2, and 121D3 extending to an inside of the gap-fill insulating film 111 may be formed using a photolithography process and an etching process.

The holes 121C, 121D1, 121D2, and 121D3 may include contact holes 121C for exposing the conductive patterns 103, respectively, and dummy holes 121D1, 121D2 and, 121D3 disposed on both sides of the contact holes 121C.

In a process of performing an exposure process for the photolithography process, optical distortion may occur in the outermost patterns. Due to the optical distortion, the dummy holes 121D1, 121D2, and 121D3 adjacent to an outer periphery among the holes 121C, 121D1, 121D2, and 121D3 arranged in a line may be formed narrower than the contact holes 121C.

The contact holes 121C arranged in a line may include a first contact hole H1 and a second contact hole H2 disposed in an outer periphery. The conductive patterns 103 may include a lower conductive pattern CP1 and an upper conductive pattern CPn overlapping the first contact hole H1 and the second contact hole H2.

According to an embodiment of the present disclosure, the optical distortion due to the exposure process may be induced into the dummy holes 121D1, 121D2, and 121D3 rather than the first contact hole H1 and the second contact hole H2. The dummy holes 121D1, 121D2, and 121D3 may include at least one of deep dummy holes 121D1 and 121D2 adjacent to the first contact hole H1 and at least one shallow dummy hole 121D3 adjacent to the second contact hole H2.

Some of the interlayer insulating films 101 may be penetrated by holes overlapping therewith. For example, one of the interlayer insulating films 101 may be disposed between the upper conductive pattern CPn and the gap-fill insulating film 111. In this case, the second contact hole H2 and the shallow dummy hole 121D3 may pass through the interlayer insulating film disposed between the upper conductive pattern CPn and the gap-fill insulating film 111.

During the etching process of the gap-fill insulating film 111 and the interlayer insulating film 101 for forming the holes 121C, 121D1, 121D2, and 121D3, an etch depth may be limited by a process margin. In this case, at least one of the deep dummy holes 121D1 and 121D2 may have a bottom surface disposed at a position spaced apart from the lower conductive pattern CP1 without exposing the lower conductive pattern CP1. According to an embodiment of the present disclosure, since a phenomenon that a diameter is narrowed due to the optical distortion caused by the exposure process is induced into the dummy holes 121D1, 121D2 and 121D3, a diameter of the first contact hole H1 may have a target numerical value or a numerical value close to the target numerical value. Therefore, in an embodiment of the present disclosure, the lower conductive pattern CP1 may be easily exposed by the first contact hole H1.

Referring to FIG. 7D, the holes 121C, 121D1, 121D2, and 121D3 shown in FIG. 7C may be filled with a conductive material. Therefore, contact plugs 131C respectively connected to the conductive patterns 103 may be formed in the contact holes 121C shown in FIG. 7C. In addition, dummy plugs 131D1, 131D2, and 131D3 may be formed in the dummy holes 121D1, 121D2, and 121D3 shown in FIG. 7C.

Referring to FIG. 7E, an upper insulating layer 141 may be formed on the gap-fill insulating film 111 including the contact plugs 131C and the dummy plugs 131D1, 131D2, and 131D3. Subsequently, via contact patterns 143 may be formed passing through the upper insulating layer 141 and connected to the contact plugs 131C, respectively.

Figure 8:
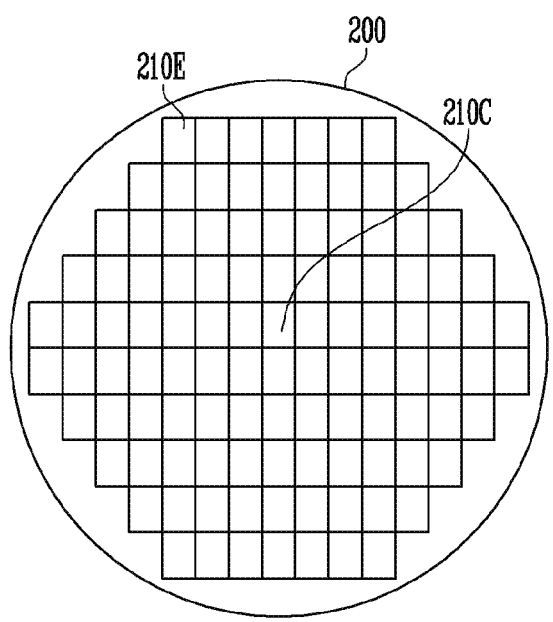
FIG. 8 illustrates a wafer including cell arrays according to embodiments of the present disclosure.

FIG. 8 illustrates a wafer 200 including cell arrays according to embodiments of the present disclosure.

The cell arrays formed on the wafer 200 may include a first cell array 210E disposed at an edge of the wafer 200 and a second cell array 210C disposed at a center of the wafer 200.

The optical distortion described above with reference to FIG. 7C may be generated in the first cell array 210E, and the second cell array 210C may be formed without optical distortion.

The first cell array 210E influenced by the optical distortion may include the gate stack bodies GST, the contact plugs, the lower dummy plugs LP1 and LP2, the upper dummy plugs UP, and the via contact patterns VC1 to VCn, described above with reference to FIGS. 5A and 5B. In addition, the first cell array 210E may be formed in the structure shown in FIG. 6A or FIG. 6B.

The second cell array 210C formed without optical distortion will be described with reference to FIGS. 9 and 10.

Figure 9:
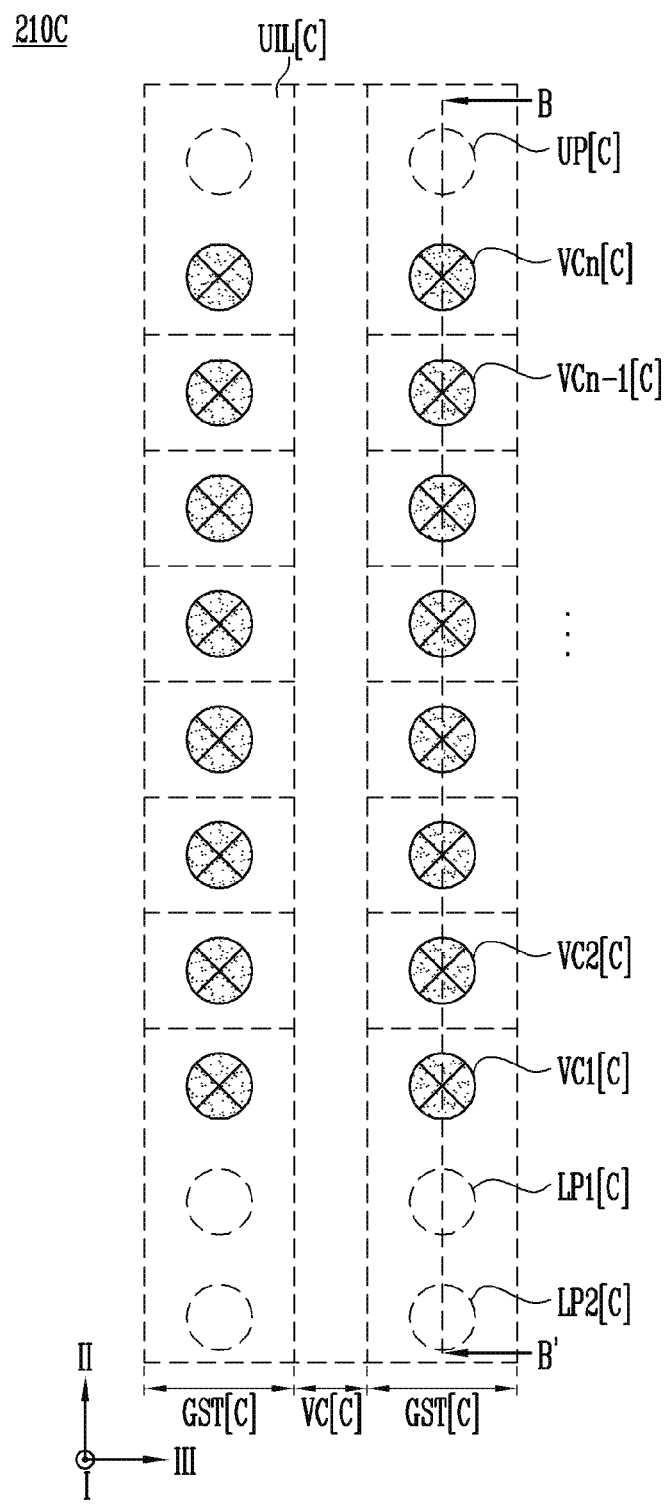
FIGS. 9 and 10 are a plan view and a cross-sectional view illustrating a second cell array shown in FIG. 8.
Figure 10:
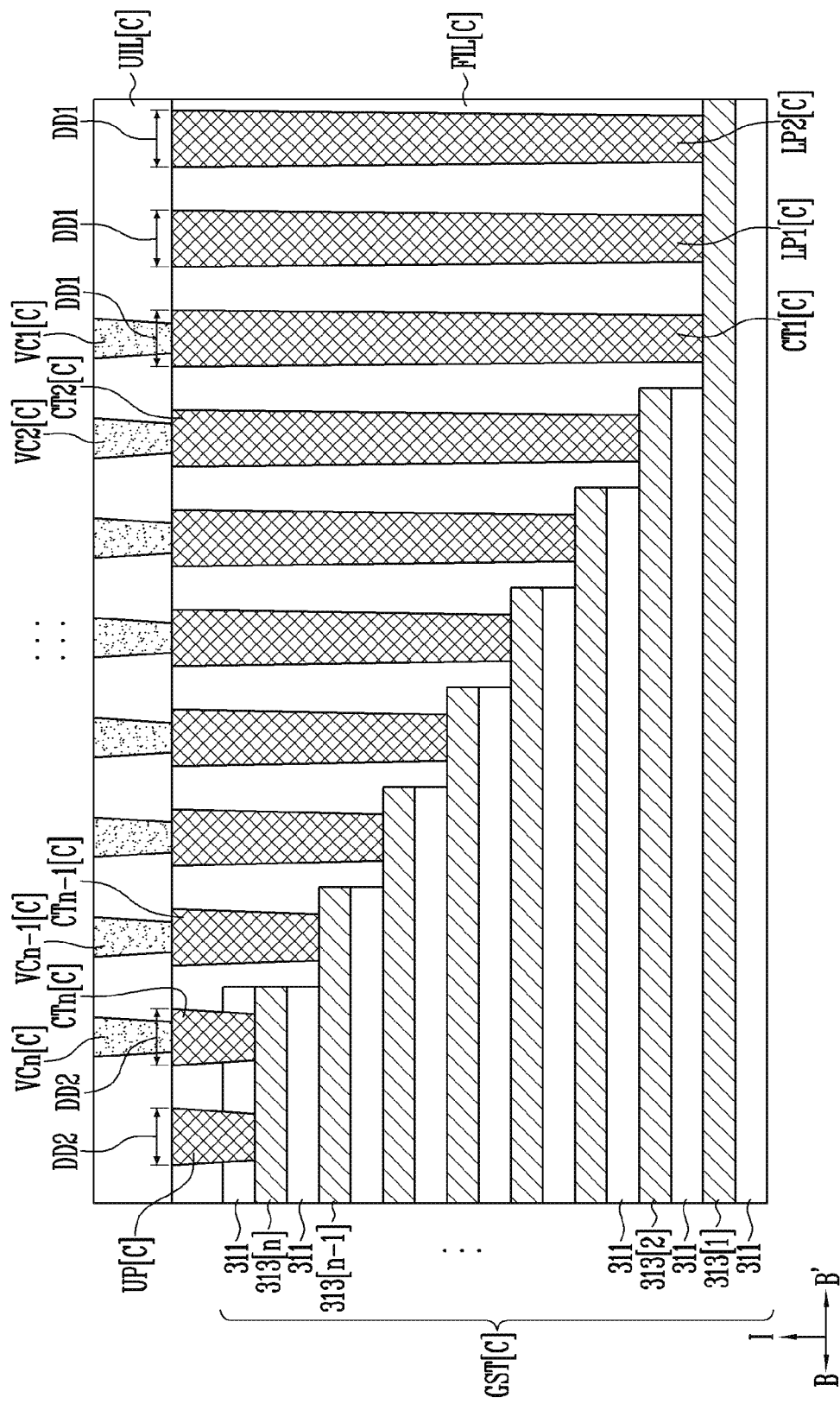

FIGS. 9 and 10 are a plan view and a cross-sectional view illustrating the second cell array 210C shown in FIG. 8. FIG. 9 shows a layout of the second cell array 210C. FIG. 10 shows a cross-section of the second cell array 210C taken along a line B-B' shown in FIG. 9.

Referring to FIGS. 9 and 10, the second cell array 210C may include gate stack bodies GST[C] separated from each other by a vertical structure VP[C], contact plugs CT1[C] to CTn[C] connected to the gate stack bodies GST[C], via contact patterns VC1[C] to VCn[C] connected to the contact plugs CT1[C] to CTn[C], lower dummy plugs LP1[C] and LP2[C] and upper dummy plugs UP[C] connected to each gate stack body GST[C]. The via contact patterns VC1[C] to VCn[C] may be disposed on the contact plugs CT1[C] to CTn[C].

The vertical structure VP[C] may be formed of the same materials as described above with reference to FIG. 5A.

Each of the gate stack bodies GST[C] may include interlayer insulating films 311 and conductive patterns 313 [1] to 313[n], which are alternately stacked in the first direction I. Each of the interlayer insulating films 311 and the conductive patterns 313[1] to 313[n] may extend in the second direction II and the third direction III intersecting with each other in the plane orthogonal to the first direction I.

The conductive patterns 313[1] to 313[n] may configure the conductive patterns CP1 to CPn described above with reference to FIGS. 3A to 3E. The conductive patterns 313[1] to 313[n] may form a step structure in a contact region of the gate stack body GST[C] corresponding thereto. The conductive patterns 313[1] to 313[n] may include a lower conductive pattern 313[1] configuring the lowermost end of the step structure, an upper conductive pattern 313[n] configuring the uppermost end of the step structure, and one or more intermediate conductive patterns 313[2] to 313[n−1] disposed between the conductive pattern 313[1] and the upper conductive pattern 313[n].

The contact plugs CT1[C] to CTn[C] may pass through a gap-fill insulating film FIL[C] covering the gate stack bodies GST[C]. The contact plugs CT1[C] to CTn[C] may include a first contact plug CT1[C] connected to the lower conductive pattern 313[1], a second plug CT[n] connected to the upper conductive pattern 313[n], and third contact plugs CT2[C] to CTn−1[C] connected to the intermediate conductive patterns 313[2] to 313[n−1]. The contact plugs CT1[C] to CTn[C] may be disposed between the upper dummy plug UP[C] and the lower dummy plug LP2[C] adjacent to the upper dummy plug UP[C]. The contact plugs CT1[C] to CTn[C] may be formed in the same structure as described above with reference to FIGS. 5A and 6B, and may be formed of various conductive materials.

The lower dummy plugs LP1[C] and LP2[C] and the upper dummy plug UP[C] may be formed of the same conductive material as the contact plugs CT1[C] to CTn[C].

The lower dummy plugs LP1[C] and LP2[C] overlap the lower conductive pattern 313[1]. The lower dummy plugs LP1[C] and LP2[C] may include a first lower dummy plug LP1[C] disposed adjacent to the first contact plug CT1[C]. The lower dummy plugs LP1[C] and LP2[C] may further include a second lower dummy plug LP2[C]. The first contact plugs CT1[C] and the lower dummy plugs LP1[C] and LP2[C] may be arranged in a line along one direction. For example, the first contact plug CT1[C] and the lower dummy plug LP1[C] and LP2[C]) may be arranged in a line in the second direction II. The number of the lower dummy plugs LP1[C] and LP2[C] arranged in one direction is not limited to that shown in the figure. For example, three or more lower dummy plugs may overlap the lower conductive pattern 313[1].

Each of the lower dummy plugs LP1[C] and LP2[C] of the second cell array 210C may be formed without optical distortion. As an embodiment, each of the lower dummy plugs LP1[C] and LP2[C] may have the same width DD1 as the first contact plug CT1[C].

The upper dummy plug UP[C] overlaps the upper conductive pattern 313[n]. The upper dummy plug UP[C] may be disposed adjacent to the second contact plug CTn[C]. For example, the upper dummy plug UP[C] and the second contact plug CTn[C] may be disposed adjacent to each other in the second direction II. The number of the upper dummy plugs UP[C] is not limited to that shown in the figure. For example, two or more upper dummy plugs may overlap the upper conductive pattern CPn[C].

The upper dummy plug UP[C] of the second cell array 210C may be formed without optical distortion. As an embodiment, the upper dummy plug UP[C] may have the same width DD2 as the second contact plug CTn[C].

The via contact patterns VC1[C] to VCn[C] may pass through an upper insulating film UIL[C] formed on the gap-fill insulating film FIL[C]. The via contact patterns VC1[C] to VCn[C] may be formed in the same structure described above with reference to FIGS. 5a, 5b, and 6b, and may be formed of various conductive materials.

The second cell array 210C described above may be formed using the processes described above with reference to FIGS. 7A to 7E.

Figure 11:
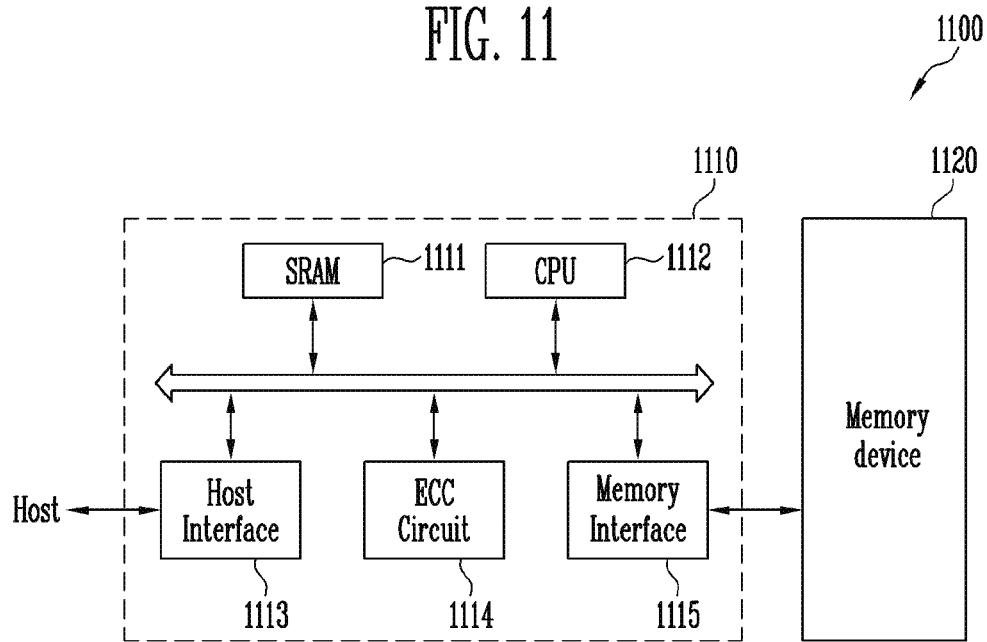
FIG. 11 is a block diagram illustrating a configuration of a memory system according to an embodiment of the present disclosure.

FIG. 11 is a block diagram illustrating a configuration of a memory system according to an embodiment of the present disclosure.

Referring to FIG. 11, the memory system 1100 according to an embodiment of the present disclosure includes a memory element 1120 and a memory controller 1110.

The memory element 1120 may be a multi-chip package configured of a plurality of flash memory chips. The memory element 1120 may include contact plugs connected to a contact region of a gate stack body and dummy plugs disposed on both sides of the contact plugs.

The memory controller 1110 is configured to control the memory device 1120 and may include a static random access memory (SRAM) 1111, a CPU 1112, a host interface 1113, an error correction circuit (ECC circuit) 1114, and a memory interface 1115. The SRAM 1111 is used as an operation memory of the CPU 1112, the CPU 1112 performs all control operations for data exchange of the memory controller 1110, and the host interface 1113 includes a data exchange protocol of a host connected to the memory system 1100. In addition, the error correction circuit 1114 detects and corrects an error included in data read from the memory element 1120 and the memory interface 1115 performs interfacing with the memory element 1120. In addition, the memory controller 1110 may further include a read only memory (ROM) that stores code data for interfacing with the host.

The memory system 1100 described above may be a memory card or a solid state drive (SSD) with which the memory element 1120 and the memory controller 1110 are combined. For example, when the memory system 1100 is an SSD, the memory controller 1110 may communicate with the outside (for example, a host) through at least one of various interface protocols such as a universal serial bus (USB), a multimedia card (MMC), a peripheral component interconnection-express (PCI-E), a serial advanced technology attachment (SATA), a parallel advanced technology attachment (PATA), a small computer small interface (SCSI), an enhanced small disk interface (ESDI), and integrated drive electronics (IDE).

Figure 12:
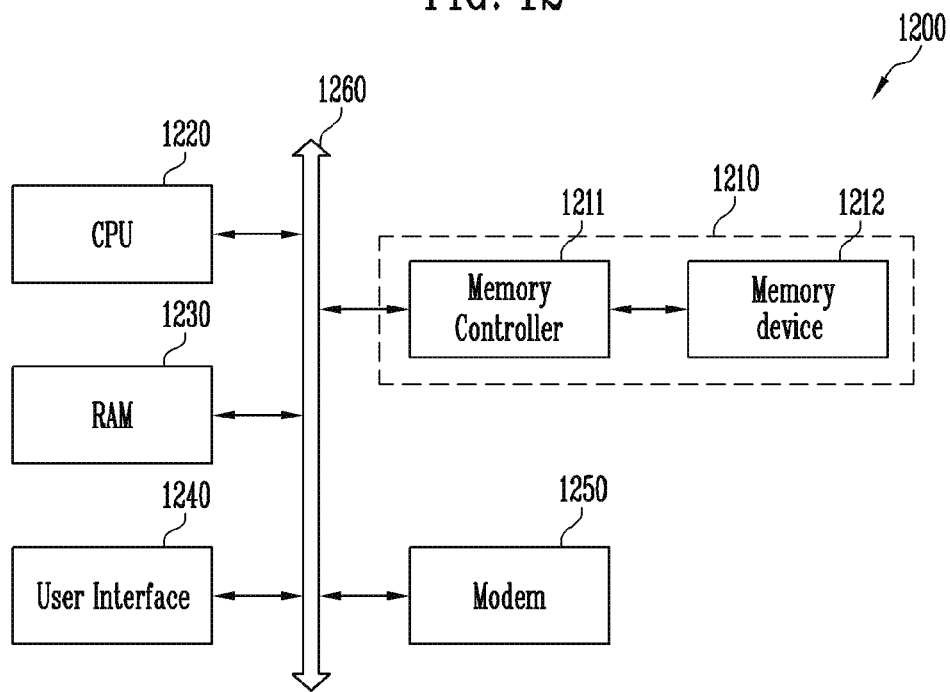
FIG. 12 is a block diagram illustrating a configuration of a computing system according to an embodiment of the present disclosure.

FIG. 12 is a block diagram illustrating a configuration of a computing system according to an embodiment of the present disclosure.

Referring to FIG. 12, the computing system 1200 according to an embodiment of the present disclosure may include a CPU 1220, a random access memory (RAM) 1230, a user interface 1240, a modem 1250, and a memory system 1210, which are electrically connected to a system bus 1260. In addition, when the computing system 1200 is a mobile device, a battery for supplying an operation voltage to the computing system 1200 may be further included, and an application chipset, a camera image processor (CIS), a mobile DRAM, and the like may be further included.

The memory system 1210 may be configured of the memory element 1212 and the memory controller 1211.

Embodiments of the present technology overlap the dummy plug with the lower conductive pattern in addition to the contact plug connected to the lower conductive pattern. Therefore, embodiments of the present technology may improve connection defects between the contact plug and the lower conductive pattern by inducing optical distortion generated during a photolithography process for forming the contact plug into the dummy plug. As a result, embodiments of the present technology may stably connect the contact plug to the lower conductive pattern, thereby improving reliability of the semiconductor memory device.

What is claimed is:

1. A semiconductor memory device comprising:
   a stack body including a lower conductive pattern and an upper conductive pattern stacked apart from each other in a first direction, and at least one intermediate conductive pattern disposed between the lower conductive pattern and the upper conductive pattern;
   a first contact plug connected to the lower conductive pattern and extending in the first direction; and
   at least one lower dummy plug overlapping the lower conductive pattern in the first direction and extending in the first direction.

2. The semiconductor memory device of claim 1, wherein the at least one lower dummy plug is formed to be narrower than the first contact plug in a plane orthogonal to the first direction.

3. The semiconductor memory device of claim 1, wherein the at least one lower dummy plug is formed to be shorter than the first contact plug in the first direction.

4. The semiconductor memory device of claim 1, wherein the lower dummy plug is spaced apart from the lower conductive pattern in the first direction.

5. The semiconductor memory device of claim 1, further comprising:
   a second contact plug connected to the upper conductive pattern and extending in the first direction; and
   at least one upper dummy plug formed to be narrower than the second contact plug in a plane perpendicular to the first direction and overlapping the upper conductive pattern.

6. The semiconductor memory device of claim 5, further comprising:
   a third contact plug connected to the intermediate conductive pattern and extending in the first direction,
   wherein the first to third contact plugs are disposed between the upper dummy plug and the lower dummy plug.

7. The semiconductor memory device of claim 1, wherein the lower conductive pattern, the intermediate conductive pattern, and the upper conductive pattern are stacked to form a step structure, and
   each of the lower conductive pattern, the intermediate conductive pattern, and the upper conductive pattern includes a contact region exposed by the step structure.

8. The semiconductor memory device of claim 7, wherein the first contact plug and the at least one lower dummy plug are overlap the contact region of the lower conductive pattern.

9. The semiconductor memory device of claim 7, wherein the first contact plug is disposed to be closer to the contact region of the intermediate conductive pattern than the lower dummy plug.

10. The semiconductor memory device of claim 7, further comprising:
    a gap-fill insulating film covering the step structure and penetrated by the first contact plug and the lower dummy plug;
    an upper insulating film disposed on the gap-fill insulating film; and
    a via contact pattern connected to the first contact plug through the upper insulating film.

11. The semiconductor memory device of claim 10, wherein the lower dummy plug is spaced apart from the via contact pattern.

12. A semiconductor memory device comprising:
    a stack body including a lower conductive pattern and an upper conductive pattern stacked apart from each other in a first direction, and at least one intermediate conductive pattern disposed between the lower conductive pattern and the upper conductive pattern, and formed in a step structure;
    a gap-fill insulating film covering the stack body;
    contact plugs connected to the lower conductive pattern, the intermediate conductive pattern, and the upper conductive pattern, respectively, and extending in the first direction to penetrate the gap-fill insulating film;
    at least one lower dummy plug overlapping the lower conductive pattern and formed in the gap-fill insulating film;
    at least one upper dummy plug overlapping the upper conductive pattern and formed in the gap-fill insulating film;
    an upper insulating film formed on the gap-fill insulating film to cover the contact plugs, the lower dummy plug, and the upper dummy plug; and
    via contact patterns penetrating the upper insulating film to be connected to the contact plugs, respectively,
    wherein an upper surface of each of the lower dummy plug and the upper dummy plug is completely covered with the upper insulating film.

13. The semiconductor memory device of claim 12, wherein the contact plugs comprise:
    a first contact plug adjacent to the lower dummy plug and connected to the lower conductive pattern; and
    a second contact plug adjacent to the upper dummy plug and connected to the upper conductive pattern.

14. The semiconductor memory device of claim 13, wherein, in a plane intersecting the first direction,
    the lower dummy plug is formed to be narrower than the first contact plug, and
    the upper dummy plug is formed to be narrower than the second contact plug.

15. The semiconductor memory device of claim 13, wherein the lower dummy plug is formed to be shorter than the first contact plug in the first direction.

16. The semiconductor memory device of claim 12, wherein the lower dummy plug is spaced apart from the lower conductive pattern in the first direction.

17. The semiconductor memory device of claim 12, further comprising:
    a channel structure penetrating the stack body and surrounded by a memory film.

18. The semiconductor memory device of claim 13, wherein the lower dummy plug is formed to have substantially the same width as the first contact plug, and
    the upper dummy plug is formed to have substantially the same width as the second contact plug.

19. A semiconductor memory device comprising:
    a stack body including a lower conductive pattern and an upper conductive pattern stacked apart from each other in a first direction, and at least one intermediate conductive pattern disposed between the lower conductive pattern and the upper conductive pattern;
    a first contact plug connected to the lower conductive pattern and extending in the first direction; and
    at least two lower dummy plugs formed to be narrower than the first contact plug in a plane orthogonal to the first direction and overlapping the lower conductive pattern, the at least two lower dummy plugs extending in the first direction.

20. The semiconductor memory device of claim 19, wherein the lower dummy plugs are formed to be narrower as a distance between the lower dummy plugs and the first contact plug increases.

* * * * *